United States Patent
May

(10) Patent No.: US 7,856,073 B2
(45) Date of Patent: Dec. 21, 2010

(54) DIGITAL GAIN ADJUSTMENT IN A WIRELESS RECEIVER

(75) Inventor: Michael R. May, Austin, TX (US)

(73) Assignee: Sigma Tel, Inc., Austin, TX (US)

( * ) Notice: Subject to any disclaimer, the term of this patent is extended or adjusted under 35 U.S.C. 154(b) by 1361 days.

(21) Appl. No.: 11/302,771

(22) Filed: Dec. 14, 2005

(65) Prior Publication Data

US 2007/0133822 A1 Jun. 14, 2007

(51) Int. Cl.
*H04L 27/08* (2006.01)
(52) U.S. Cl. .................................... 375/348
(58) Field of Classification Search ................. 375/345, 375/348
See application file for complete search history.

(56) References Cited

U.S. PATENT DOCUMENTS

| | | | |
|---|---|---|---|
| 6,005,506 A * | 12/1999 | Bazarjani et al. | 341/143 |
| 6,483,632 B1 * | 11/2002 | Jolley et al. | 359/337.4 |
| 6,947,711 B1 * | 9/2005 | Leyonhjelm | 455/114.3 |
| 7,254,198 B1 * | 8/2007 | Manickam et al. | 375/348 |
| 2004/0046875 A1 * | 3/2004 | Itani et al. | 348/229.1 |
| 2007/0047669 A1 * | 3/2007 | Mak et al. | 375/316 |

* cited by examiner

*Primary Examiner*—David C Payne
*Assistant Examiner*—Tanmay K Shah
(74) *Attorney, Agent, or Firm*—Charles W. Bethards

(57) ABSTRACT

A radio receiver includes a communication interface, a mixing module, an analog to digital converter, a digital gain block, and a gain setting block. The communication interface receives a continuous time radio signal. The mixing module down converts the continuous time radio signal to a continuous time analog signal. The analog to digital converter converts the continuous time analog signal to a sequence of input digital samples. The digital gain block receives the sequence of input digital samples and gain adjusts the sequence of input digital samples based upon a gain setting to produce a sequence of output digital samples. The gain setting block produces the gain setting at any time as one of a first fixed gain setting, a second fixed gain setting, and a filtered time varying gain when transitioning between the first fixed gain setting and the second fixed gain setting.

23 Claims, 9 Drawing Sheets battery-powered handheld audio device 10 battery-powered handheld audio device 90

DIGITAL GAIN ADJUSTMENT IN A WIRELESS RECEIVER

BACKGROUND

1. Technical Field

This invention relates generally to wireless receivers and more particularly to gain control within a wireless receiver.

2. Description of Related Art

Handheld digital audio systems are becoming very popular. Such systems include digital audio players/recorders that record and subsequently playback MP3 files, WMA files, et cetera. Such digital audio players/recorders may also be used as digital dictaphones and file transfer devices. Further expansion of digital audio players/recorders includes providing a frequency modulation ("FM") radio receiver such that the device offers FM radio reception.

A typical digital. FM receiver receives a continuous time radio signal, amplifies the continuous time radio signal, down converts the continuous time radio signal to a baseband/low IF signal, and then filters the signal, all in the analog domain. Then, the digital FM receiver samples the analog baseband/low IF signal and digitally processes the FM signal. Such digital processing includes digital filtering and audio content extraction. In order to achieve maximum fidelity from the digitized signal, a magnitude of the digitized signal should be as near 100% saturation as possible of the data width of a circuit that performs the digital processing, e.g., a Digital Signal Processor. The magnitude of the analog FM signal, however, varies over time between a relatively strong signal and a relatively week signal. The time-varying magnitude of the FM continuous time radio signal directly relates to the digitized signal, which diminishes the ability of the digital circuitry to produce an accurate audio signal. There exists a need to solve these signal processing problems.

DETAILED DESCRIPTION OF THE DRAWINGS

Figure 1:
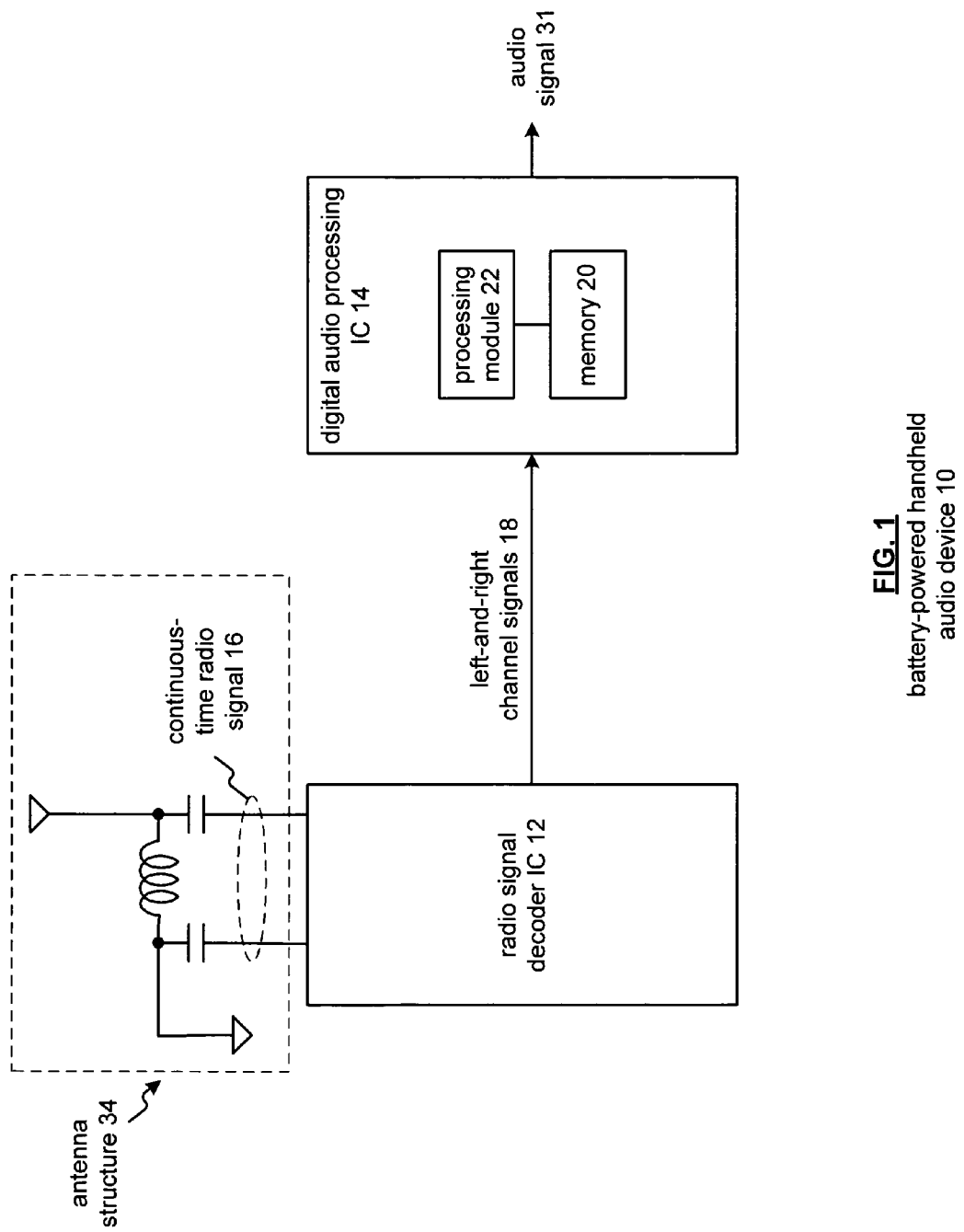
FIG. 1 is a schematic block diagram of a battery-powered handheld audio device in accordance with the present invention.

FIG. 1 is a schematic block diagram of a handheld audio system 10 that includes a radio signal decoder integrated circuit 12, a digital audio processing integrated circuit 14, and an antenna structure 34. The digital audio processing integrated circuit 14 includes a processing module 22, memory 20, and additional components (not shown). The processing module 22 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 20 may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 14 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory 20 stores, and the processing module 22 executes operational instructions.

The antenna structure includes a plurality of elements that, together, produce a continuous time radio signal 16. The radio signal decoder IC 12 converts the continuous time radio signal 16 into left-and-right channel signals 18, which may be analog or digital signals. In one embodiment, the left-and-right channel signals 18 include a left-plus-right ("LPR") signal and a left-minus-right ("LMR") signal. The radio signal decoding IC 12 provides the left-and-right channel signals 18 to the digital audio processing IC 14. The digital audio processing integrated circuit 14 receives the left-and-right channel signals 18 and produces there from audio signals 31. The digital audio processing IC 14 may provide the audio signals 31 to a headphone set or other type of speaker output. As an alternative to producing the audio signals 31 from the left-and-right channel signals 18, the digital audio processing integrated circuit 14 process stored MP3 files, stored WMA files, and/or other stored digital audio files to produce the audio signals 31.

Figure 2:
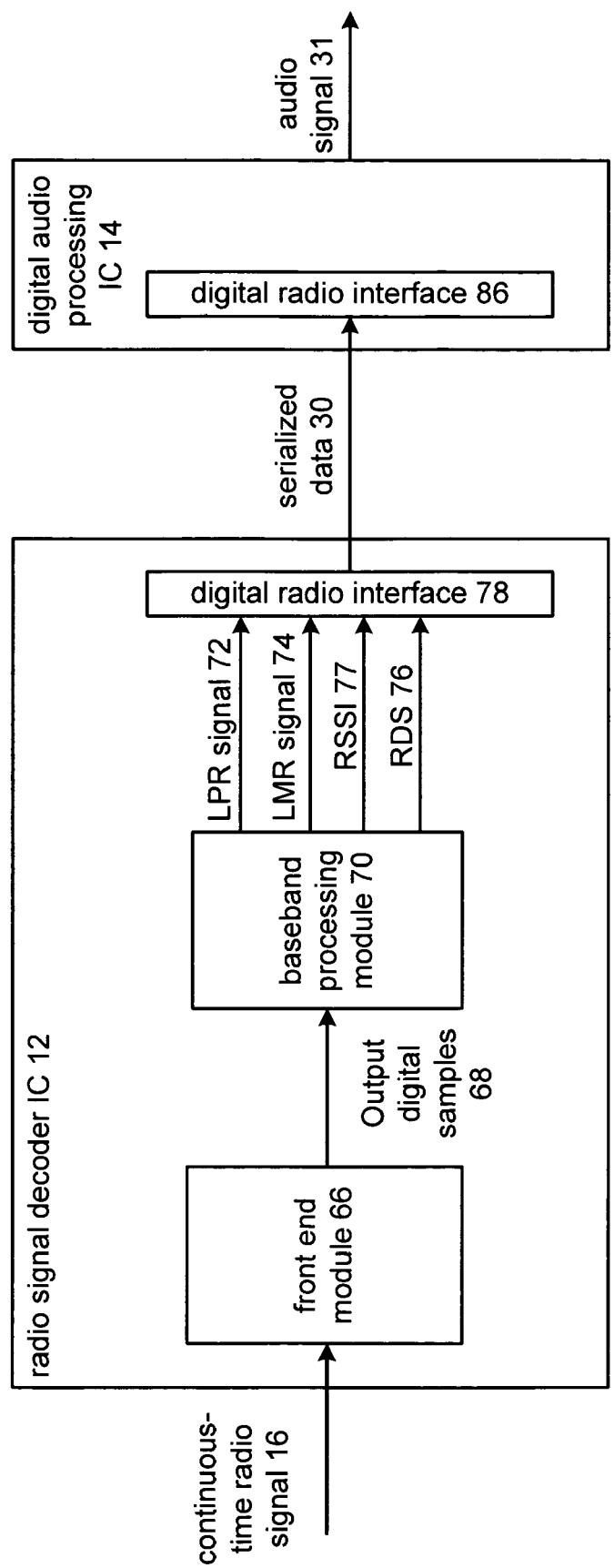
FIG. 2 is a schematic block diagram of another embodiment of a battery-powered handheld audio device in accordance with the present invention.

FIG. 2 is a schematic block diagram of another embodiment of a handheld audio system 90 that includes the radio signal decoder IC 12 and the digital audio processing IC 14. In this embodiment, the radio signal decoder IC 12 includes a front-end module 66, a baseband processing module 70, and a digital radio interface 78. The digital audio processing IC 14 includes a digital radio interface 86 and other components that were described with reference to FIG. 1. The front-end module 66 contains circuitry to process and convert the received continuous time radio signal 16 to digital data, shown as output digital samples 68. The baseband processing module 70 is operably coupled to convert the output digital samples 68 into digital baseband signals and to produce therefrom the LPR signal 72 and LMR signal 74 that contain the audio data provided by the continuous time radio signal 16. The digital radio interface 78 is operably coupled to the digital radio interface 86 to provide the LPR signal 72, the LMR signal 74, and Radio Data System (RDS) data 76 to the digital audio processing integrated circuit 14. Within the radio signal decoder IC 12, the digital radio interface 78 converts the parallel LPR signal 72, LMR signal 74, and RDS data 76 into a serialized data signal 30. The digital radio interface 86 receives the serialized data 30 and converts the serialized data 30 into parallel signals for further audio signal processing by the digital audio processing IC 14.

Figure 3:
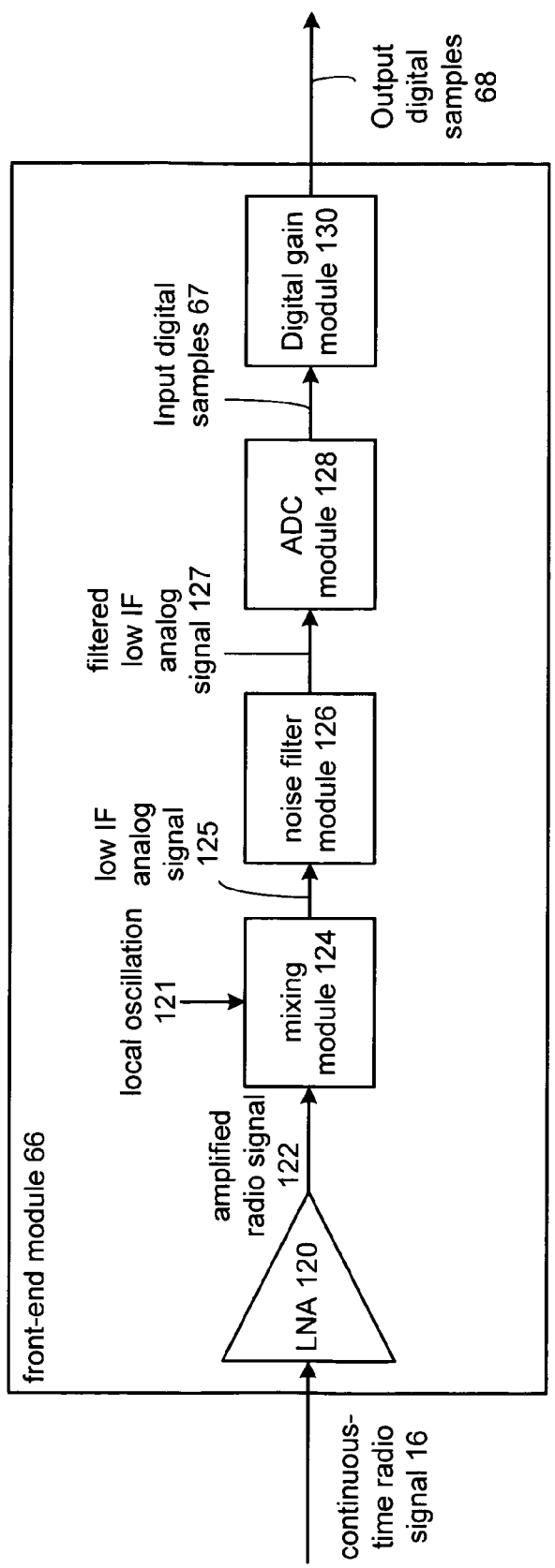
FIG. 3 is a schematic block diagram of a front-end module constructed according to the present invention.

FIG. 3 is a schematic block diagram of a front-end module constructed according to the present invention. The front-end module 66 includes a low noise amplifier ("LNA"), a mixing module 124, a noise filter module 126, an analog-to digital converter ("ADC") module 128, and a digital gain module 130. The LNA 120 amplifies the continuous time radio signal 16 to provide an amplified radio signal 122. The LNA 120 reduces the overall noise figure of the front-end module 66 in that the input-referred noise of the subsequent stages can be reduced by the adjusting the gain of the low noise amplifier 120. For example, the LNA 120 boosts the desired signal power of weak signals while adding as little noise or distortion as possible. The gain of the LNA 120 is adjustable.

The mixing module 124 receives and down-converts the amplified radio signal 122 based upon a local oscillation 121 to produce a low IF analog signal 125. The noise filter module 126 receives the low IF analog signal 125 and removes unwanted signal portions, or noise, introduced by the mixing module 124 to provide a filtered low IF analog signal 127. The ADC module 128 receives and converts the filtered low IF analog signal 127 to produce input digital samples 67 to a digital gain module 130. In one embodiment, the input digital samples 67 are a complex signal including an in-phase ("I") component and a quadrature ("Q") component. Accordingly, the ADC module 128 converts the I and Q components of the filtered low IF signal 127 into a corresponding I and Q digital signal 67.

The digital gain module 130 receives the input digital samples 67 output by ADC module 128 and, according to the present invention, digitally gains the input digital samples 67 to produce output digital samples 68. A data width of the input digital samples 67 corresponds to a data output width of the ADC module 128 while a data width of the output digital samples 68 corresponds to a data width of the baseband processing module 70. The digital gain module 130 may include both I and Q components.

Figure 4:
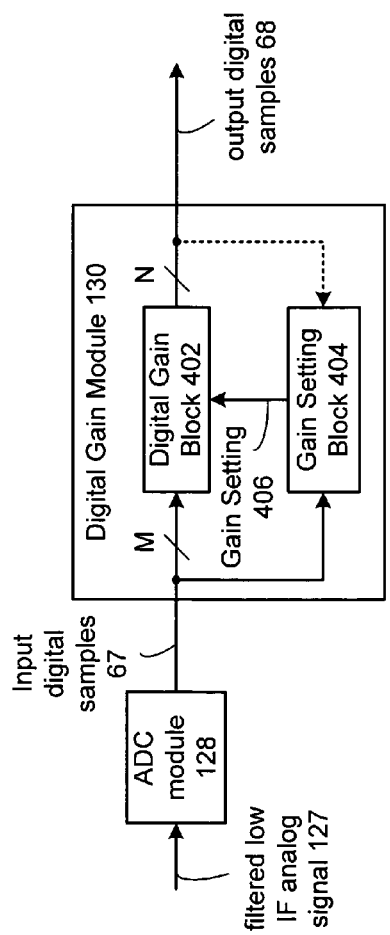
FIG. 4 is a block diagram illustrating a digital gain module constructed according to an embodiment of the present invention.

FIG. 4 is a block diagram illustrating a digital gain module constructed according to an embodiment of the present invention. The digital gain module 130 includes a digital gain block 402 and a gain setting block 404. The digital gain block 402 is operable to receive a sequence of input digital samples 67 and to gain adjust the sequence of input digital samples 67 based upon a gain setting 406 to produce the sequence of output digital samples 68. The gain setting block 404 communicatively couples to the digital gain block 402 and is operable to produce the gain setting 406. The gain setting block 404 is operable to produce the gain setting 406 at any time as one of a first fixed gain setting, a second fixed gain setting, or a filtered time varying gain setting. The filtered time varying gain setting is applied when the gain setting block 404 transitions the gain setting 406 between the first fixed gain setting and the second fixed gain setting.

According to another embodiment of the digital gain module 130, the gain setting block 404 is further operable to produce the gain setting 406 at any time as one of a third fixed gain setting as well. This concept may be extended to fourth, fifth, or additional fixed gain settings. When the gain setting block 404 produces the third fixed gain setting, the gain setting block 404 is further operable to apply the filtered time varying gain setting when transitioning between the first fixed gain setting and the third fixed gain setting and when transitioning between the second fixed gain setting and the third fixed gain setting.

According to a first embodiment of the digital gain module 130, the gain setting block 404 selects the gain setting 406 based upon at least one value of the sequence of input digital samples 67. According to another embodiment, shown optionally in FIG. 4, the gain setting block 404 is operable to select the gain setting 406 based upon at least one Value of the sequence of output digital samples 68.

According to one aspect of the digital gain module, an input of the digital gain block 402 has a first data width, M. Further, an output of the digital gain block 402 has a second data width, N. The gain setting block 404, according to this embodiment produces the gain setting 406 so that the sequence of output digital samples 68 substantially fills the second data width N.

In one particular embodiment, described with reference to FIGS. 2 and 3, the first data width M corresponds to an output width of the ADC module 128. Further, the second data width N corresponds to an input width of the baseband processing module 70 digital signal processor communicatively coupled to the output of the digital gain block 402. With another particular embodiment, described with reference to FIG. 1, the output of radio signal decoder IC 12 is produced by the digital gain module 130. In such case, the gain setting 406 is selected so that the left and right channel signals 18 fill available width of the interconnection to the digital audio processing IC 14.

Figure 5:
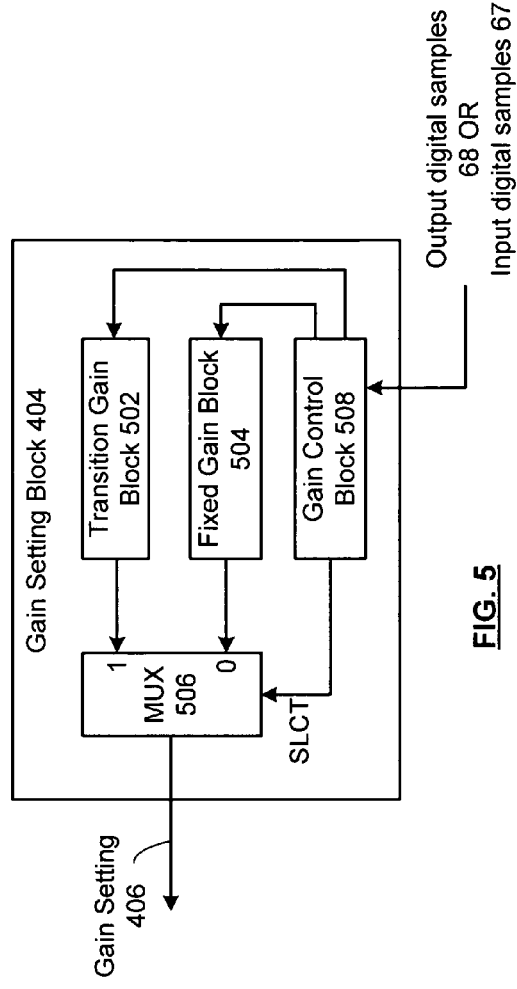
FIG. 5 is a block diagram illustrating components of a gain setting block of FIG. 4 according to an embodiment of the present invention.

FIG. 5 is a block diagram illustrating components of the gain setting block of FIG. 4 according to one embodiment of the present invention. The gain setting block 404 includes a transition gain block 502, a fixed gain block 504, a multiplexer 506, and a gain control block 508. The transition gain block 502 is operable to produce the filtered time varying gain setting based upon its input provided by the gain control block 508. The fixed gain block 504 is operable to produce the first fixed gain setting or the second fixed gain setting based upon its input provided by the gain control block 508. The multiplexer 506 has a pair of signal inputs (shown as input 1 and input 0), communicatively coupled to receive the outputs of the transition gain block 502 and the fixed gain block 504. The multiplexer 506 further has a selection input controlled by the gain control block 508 and an output that produces the gain setting 406. The gain control block 508 is operable to provide the inputs to the transition gain block 506, the inputs to the fixed gain block 504, and the selection input to the multiplexer 406.

Referring now to FIGS. 3, 4, and 5, according to a method of the present invention, a continuous time radio signal is received by front end module 66. This continuous time radio signal 16 is amplified by LNA 120 to produce an amplified radio signal 122. The amplified radio signal 122 is then down converted by mixing module 124 to produce a continuous time analog signal, also known as the low IF analog signal 125. This low IF analog signal 125 may be filtered by noise filter module 126 to produce the continuous time analog signal also known as the filtered low IF analog signal 127. The ADC module 128 is operable to convert continuous time analog signal 127 to a sequence of input digital samples 67. The digital gain module 130 is operable to gain adjust the sequence of input digital samples 67 based upon a gain setting to produce a sequence of output digital samples 68.

The gain setting is produced at any time as one of a first fixed gain setting, a second fixed gain setting, and a filtered time varying gain setting. The filtered time varying gain setting is applied when transitioning between the first fixed gain setting and the second fixed gain setting. As shown in FIG. 4, the method may include determining the gain setting 406 based upon the input digital samples 67 or the output digital samples 68.

Figure 6:
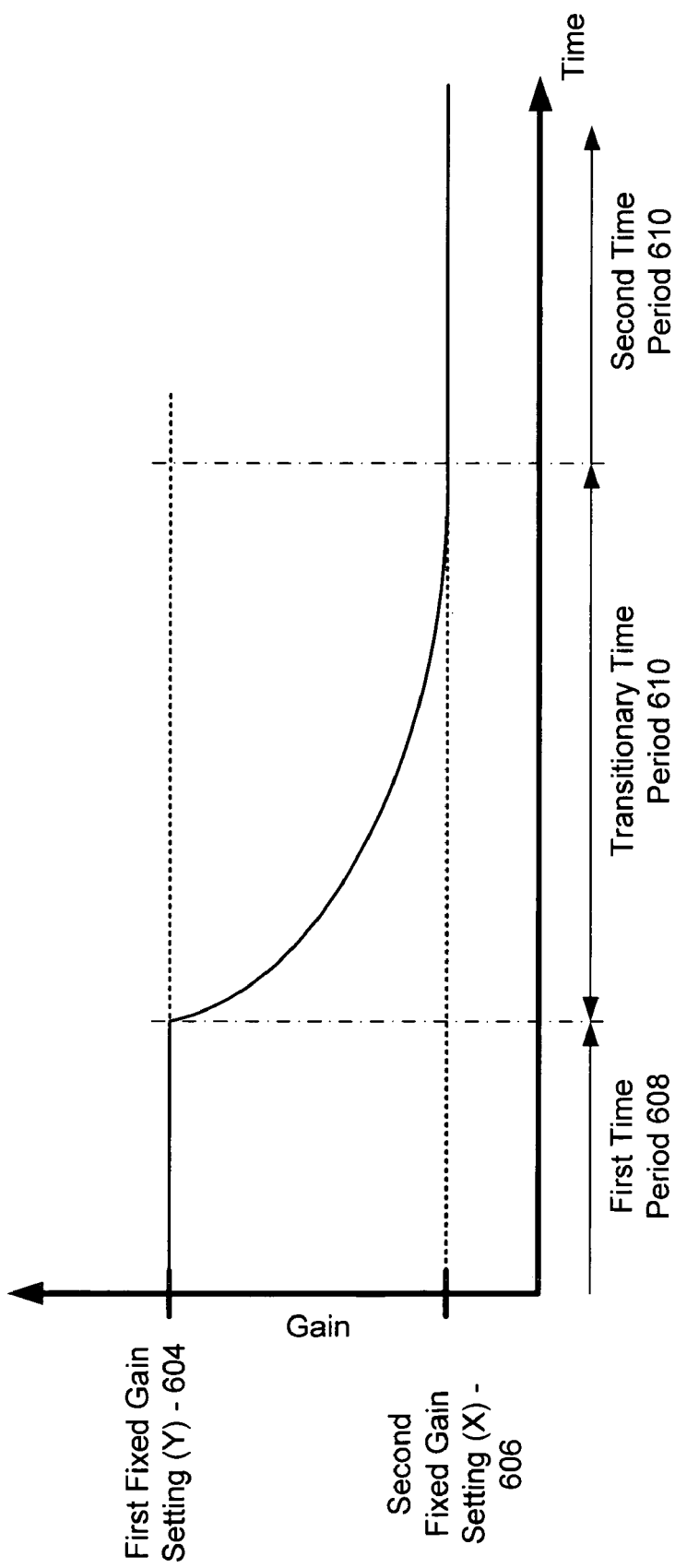
FIG. 6 is a graph illustrating a gain setting produced over time by the gain setting block to the digital gain block of the digital gain module of FIG. 4 according to one embodiment of the present invention.

FIG. 6 is a graph illustrating a gain setting produced over time by the gain setting block to the digital gain block of the digital gain module of FIG. 4 according to one embodiment of the present invention. As shown in FIG. 6, during a first time period 608, the gain setting block 404 produces a first fixed gain setting (Y) 604. Based upon a value of either the input digital samples 67 or the output digital samples 70, the gain setting block 404 determines that a transition to a second fixed gain setting (X) 606 is required. Thus, during transitionary period 610, the gain setting block 404 produces the filtered time varying gain setting while transitioning from the first fixed gain setting (Y) 604 to the second fixed gain setting (X) 606. When the end of the transitionary time period 610 expires, the gain setting block 404 produces the second fixed gain setting (X) 606.

Figure 7:
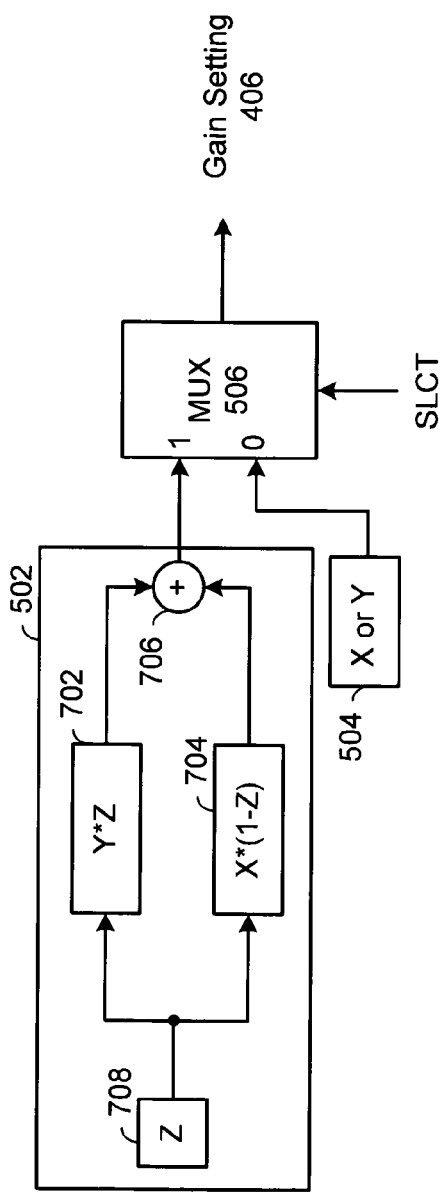
FIG. 7 is a block diagram illustrating one particular structure of the gain setting block of FIGS. 4 and 5.

FIG. 7 is a block diagram illustrating one particular structure of the gain setting block of FIGS. 4 and 5. In particular, FIG. 7 shows the fixed gain block 504, the transition gain block 502, and the multiplexer 506. The transition gain block 502 includes a first multiplier block 702, a second multiplier block 704, an adder 706, and a function generator 708. The transition gain block 502 receives an input Z from the function generator block 708, the function Z further described with reference to FIG. 8. Gain block 702 implements the function Y*Z while gain block 704 implements the function X*(1−Z).

Referring to FIGS. 6 and 7, during the first time period 608, the gain control block 508 asserts the select signal to multiplexer 506 to select the fixed gain block 504, which produces the first fixed gain setting Y. During the transitionary time period 610, the gain control block 508 asserts the select signal to multiplexer 506 to select the transition gain block 502. Then, the gain control block assets the select signal to multiplexer 506 to select the fixed gain block 504, which produces the second fixed gain setting X.

Figure 8:
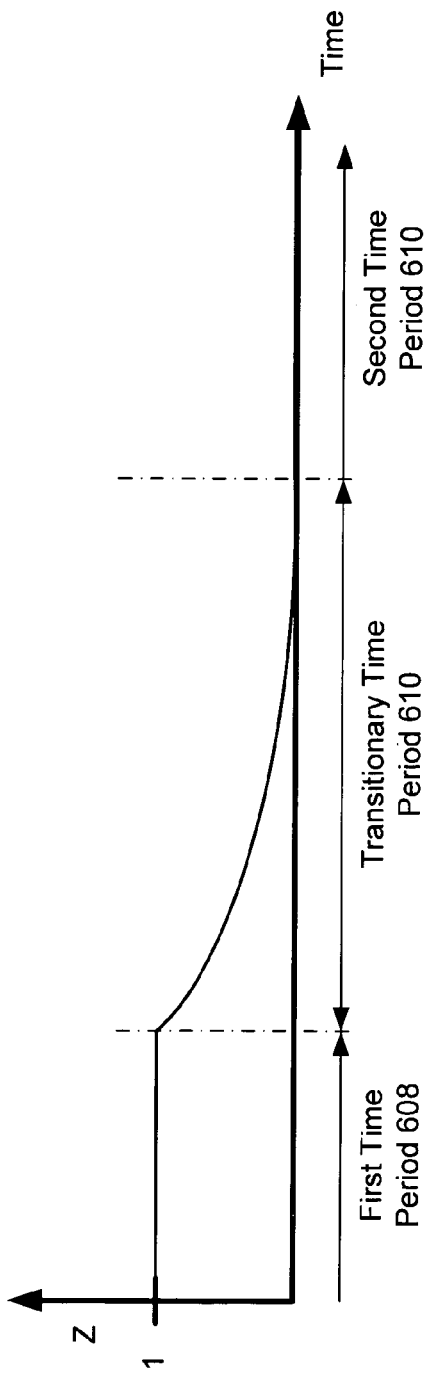
FIG. 8 is a graph illustrating a variable (Z) produced by a transition gain block of FIG. 7.

FIG. 8 is a graph illustrating the variable Z produced to the transition gain block 502 of FIG. 7. As is shown, during the first time period 608, the variable Z has a value 1. Further, during the transitionary time period 610, the variable Z transitions exponentially from 1 to 0 such that the variable is substantially 0 value at the end of transitionary time period 610. Further, during the second time period 610, the variable Z is 0. Referring briefly again to FIG. 6 again, during the transitionary time period 610, the gain setting 406 produced by gain setting block 404 exponentially decays from the first fixed gain setting (Y) 604 to the second fixed gain setting (X) 606.

Figure 9:
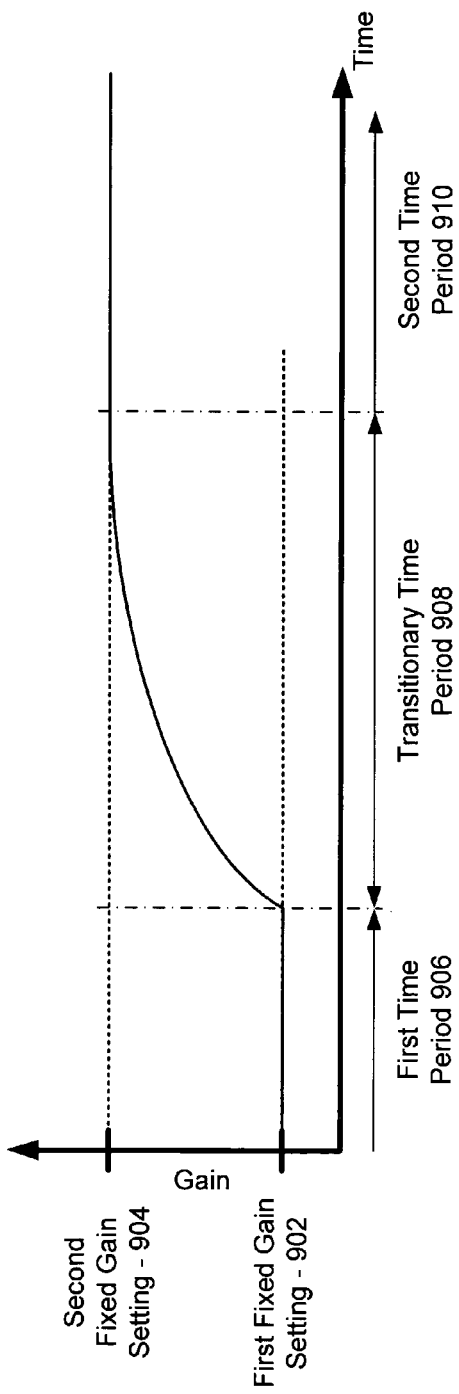
FIG. 9 is a graph illustrating a filtered time varying gain setting produced by the transition gain block of FIG. 5 according to another embodiment of the present invention.

FIG. 9 is a graph illustrating a filtered time varying gain setting produced by transition gain block of FIG. 5 according to another embodiment of the present invention. The transition gain block produces a first fixed gain setting 902 during a first time period 906 and produces a second fixed gain setting 904 during a second time period 910. The transition gain block produces a filtered time varying gain setting during a transitionary time period 908 that extends exponentially from the first fixed gain setting 902 to the second fixed gain setting 904.

Figure 10:
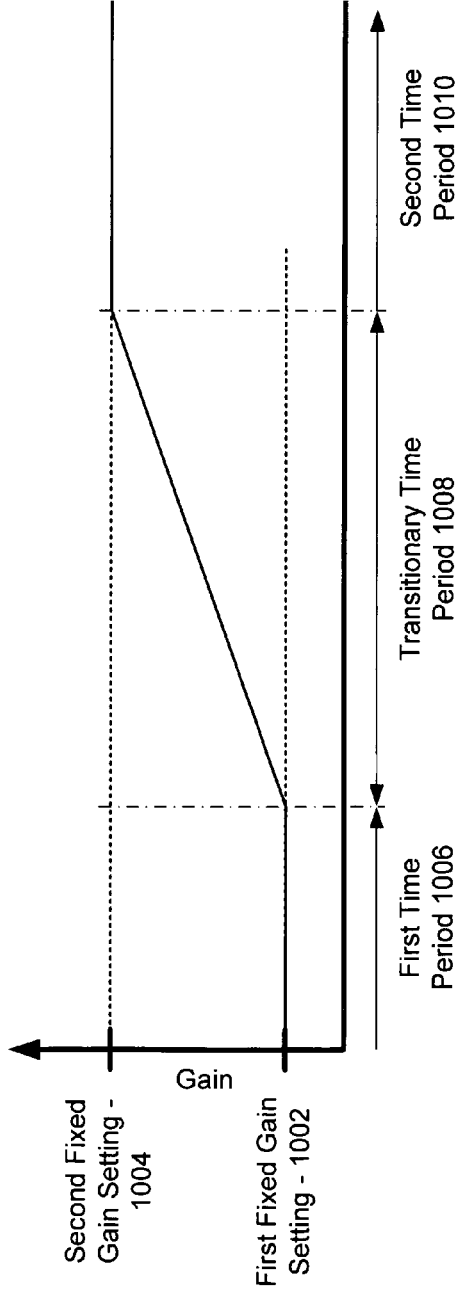
FIG. 10 is a graph illustrating another filtered time varying gain setting produced by the transition gain block of FIG. 5 according to yet another embodiment of the present invention.

FIG. 10 is a graph illustrating another filtered time varying gain setting produced by the transition gain block of FIG. 5 according to yet another embodiment of the present invention. According to the embodiment of FIG. 10, during a first time period 1006, the fixed gain block 504 produces a fixed gain setting 1002. Further, during a second time period 1010, the fixed gain block 504 produces a second fixed gain setting 1004. However, during transitionary time period 1008, the transition gain block 502 produces a time varying transition gain setting 406 that ramps from the first fixed gain setting 1002 to the second fixed gain setting 1004 throughout the transitionary time period 1008.

Figure 11:
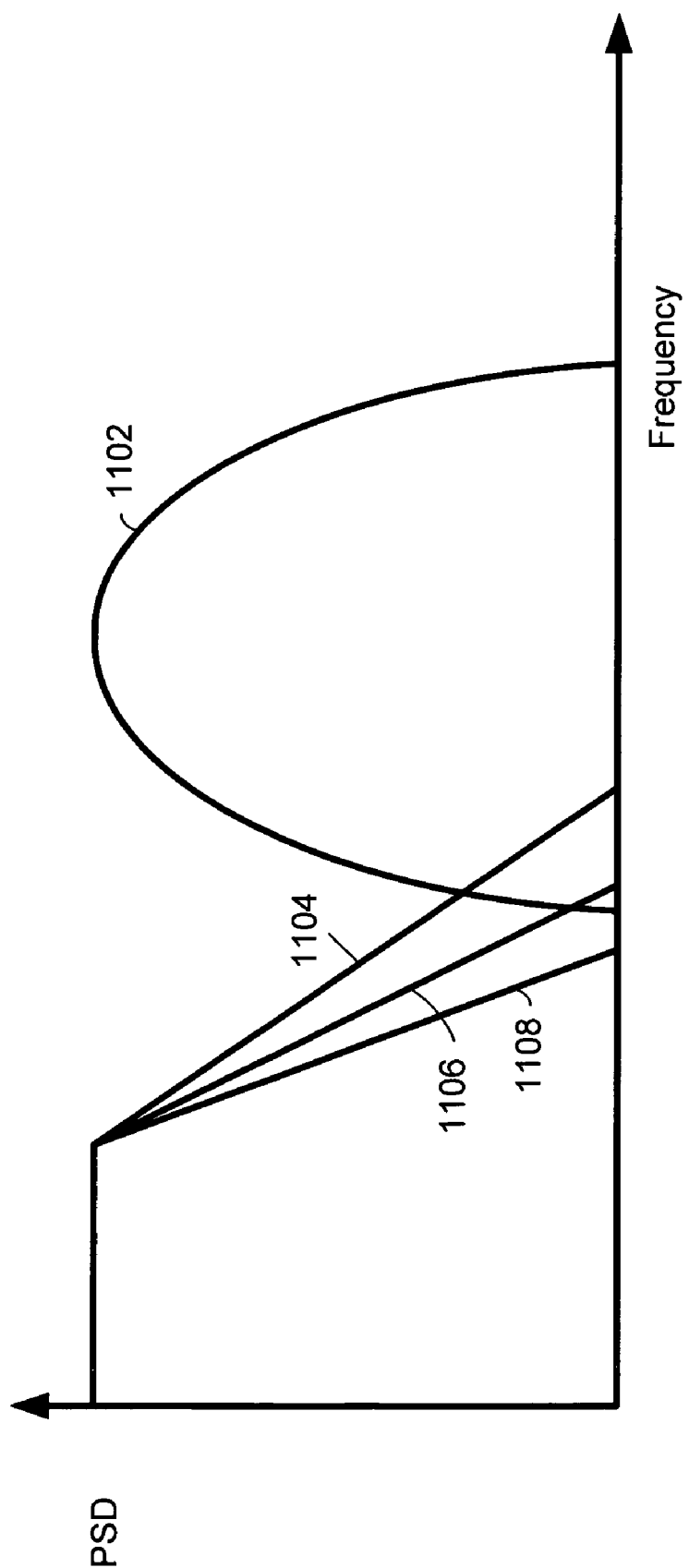
FIG. 11 is a graph illustrating power spectral densities of filtered time varying gain settings produced by the transition gain block of FIG. 5 and of the sequence of input digital samples.

FIG. 11 is a graph illustrating power spectral densities of filtered time varying gain settings produced by the transition gain block of FIG. 5 and of the sequence of input digital samples. A power spectral density 1102 of the sequence of input digital samples is substantially non-convergent with power spectral densities 1104, 1106, and 1108 of corresponding filtered time varying gain settings. When a first order filtered time varying gain setting 1104 is used, there is some convergence with the power spectral density 1102 of the sequence of input digital samples 1102. When a second order filtered time varying gain setting 1106 is employed, there is less convergence with the power spectral density 1102 of the sequence of input digital samples. Further, when a third order filtered time varying gain setting 1108 is employed, there is almost no convergence with the power spectral density 1102 of the sequence of input digital samples.

Figure 12:
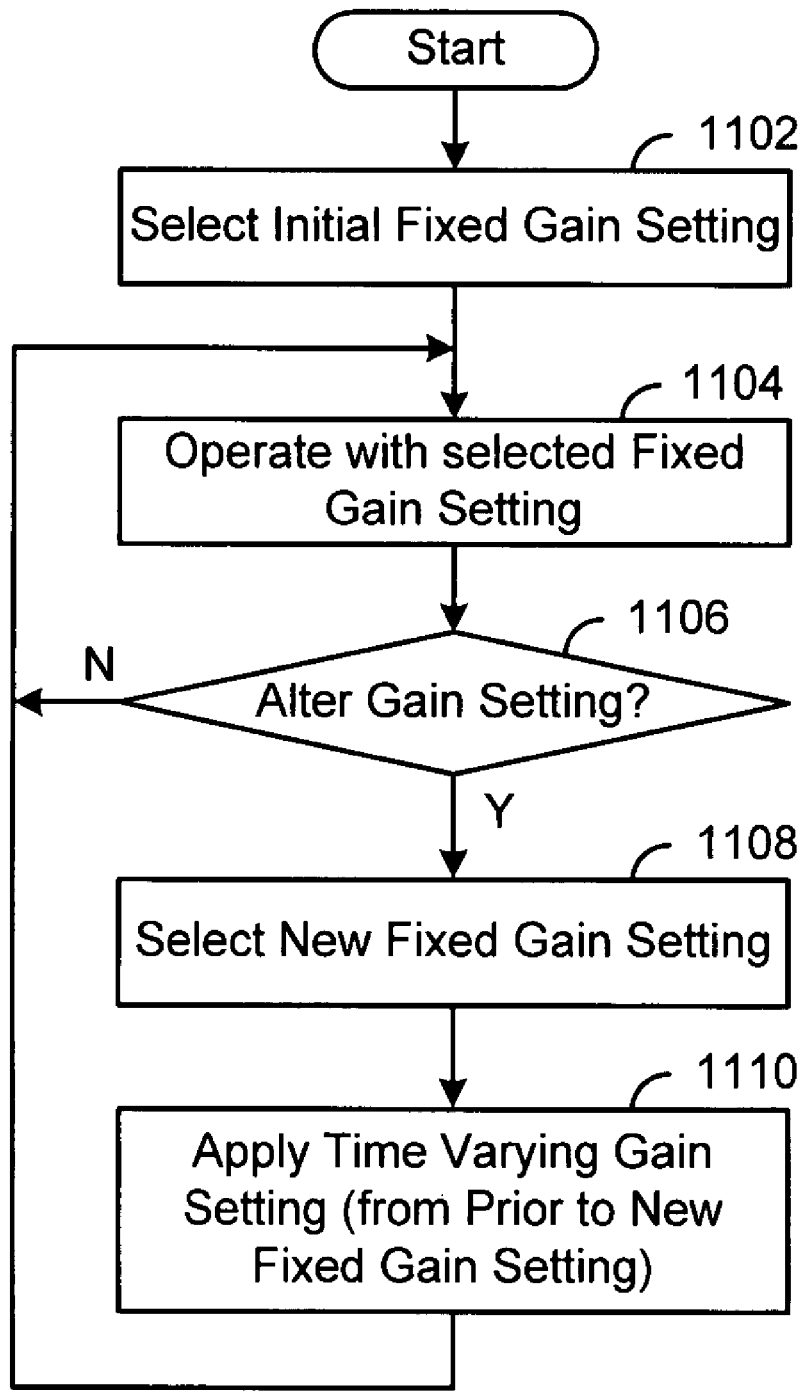
FIG. 12 is a flow chart illustrating gain setting selection operations according to an embodiment of the present invention.

FIG. 12 is a flow chart illustrating gain setting selection operations according to an embodiment of the present invention. The method includes initially selecting an initial fixed gain setting (Step 1102). Then operation includes operating with the selected fixed gain setting (Step 1104). Such operations may include receiving a continuous time radio signal, down converting the continuous time radio signal to a continuous time analog signal, converting the continuous time analog signal to a sequence of input digital samples, and gain adjusting the sequence of input digital samples based upon the selected fixed gain setting to produce a sequence of output digital samples.

During these operations, the gain setting block continually evaluates the selected gain setting based upon one or more values of the sequence of input digital samples and/or the sequence of output digital samples (Step 1106). When no alteration of the gain setting is required, operation returns to step 1104. However, when operation of step 1106 indicates that change is required, operation includes selecting a new fixed gain setting (Step 1108). After the new fixed gain setting is determined, a filtered time varying gain setting is applied when transitioning between the first fixed gain setting and the second fixed gain setting (Step 1110); Once the transitionary period is complete, operation returns to step 1104.

As one of ordinary skill in the art will appreciate, the term "substantially" or "approximately", as may be used herein, provides an industry-accepted tolerance to its corresponding-term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (that is, where one element is coupled to another element by inference) includes direct and indirect coupling between two elements in the same manner as "operably coupled." As one of ordinary skill in the art will further appreciate, the term "compares favorably," as may be used herein, indicates that a comparison between two or more elements, items, signals, et cetera, provides a desired relationship. For example, when the desired relationship is that a first signal has a greater magnitude than a second signal, a favorable comparison may be achieved when the magnitude of the first signal is greater than that of the second signal or when the magnitude of the second signal is less than that of the first signal.

The preceding discussion has presented a battery-powered handheld audio device that incorporates a radio signal decoder integrated circuit having a digital radio interface with the capability to manage power of the device based on signal quality and/or remaining battery-charge indicia. As one of average skill in the art will appreciate, other embodiments may be derived from the teaching of the present invention without deviating from the scope of the claims.

What is claimed is:

1. An apparatus comprising:
   a communication interface operable to receive a continuous time radio signal;
   a mixing module communicatively coupled to the communication interface and operable to down convert the continuous time radio signal to a continuous time analog signal;
   an analog to digital converter communicatively coupled to the mixing module and operable to convert the continuous time analog signal to a sequence of input digital samples;
   a digital gain block operable to receive the sequence of input digital samples to gain adjust the sequence of input digital samples based upon a gain setting to produce a sequence of output digital samples; and
   a gain setting block communicatively coupled to the digital gain block and operable to produce the gain setting, the gain setting block operable to produce the gain setting at any time as one of:
   a first fixed gain setting;
   a second fixed gain setting; and
   a filtered time varying gain setting applied when transitioning between the first fixed gain setting and the second fixed gain setting, wherein:
   an input of the digital gain block has a first data width;
   an output of the digital gain block has a second data width; and
   the gain setting block produces the gain setting so that the sequence of output digital samples substantially fills the second data width and wherein:
   the first data width corresponds to an output width of an analog to digital that samples the time wise continuous analog communication signal to produce the sequence of input digital samples; and
   the second data width corresponds to an input width of a digital signal processor communicatively coupled to the output of the digital gain block.

2. The apparatus of claim 1, wherein the gain setting block selects the gain setting based upon at least one value of the sequence of input digital samples.

3. The apparatus of claim 1, wherein the gain setting block selects the gain setting based upon at least one value of the sequence of output digital samples.

4. The apparatus of claim 1, wherein a power spectral density of the filtered time varying gain setting is lower in frequency and substantially non-overlapping with a power spectral density of the sequence of input digital samples.

5. An apparatus comprising:
   a communication interface operable time radio signal;
   a mixing module communicatively coupled to the communication interface and operable to down convert the continuous time radio signal to a continuous time analog signal;
   an analog to digital converter communicatively coupled to the mixing module and operable to convert the continuous time analog signal to a sequence of input digital samples;
   a digital gain block operable to receive the sequence of input digital samples to gain adjust the sequence of input digital samples based upon a gain setting to produce a sequence of output digital samples; and
   a gain setting block communicatively coupled to the digital gain block and operable to produce the gain setting, the gain setting block operable to produce the gain setting at any time as one of:
   a first fixed gain setting;
   a second fixed gain setting; and
   a filtered time varying gain setting applied when transitioning between the first fixed gain setting and the second fixed gain setting, wherein the gain setting block comprises:
   a transition gain block having an input and an output operable to produce the filtered time varying gain setting based upon the input;
   a fixed gain block having an input and an output operable to produce the first fixed gain setting or the second fixed gain setting based upon the input;
   a multiplexer having a pair of signal inputs communicatively coupled to receive the outputs of the transition gain block, and the fixed gain block, a selection input, and an output that produces the gain setting; and
   a gain control block communicatively coupled to the transition gain block, the fixed gain block, and the multiplexer, the gain control block operable to provide the input to the transition gain block, the input to the fixed gain block, and the selection input to the multiplexer.

6. The apparatus of claim 5, wherein:
   an input of the digital gain block has a first data width;
   an output of the digital gain block has a second data width; and
   the gain setting block produces the gain setting so that the sequence of output digital samples substantially fills the second data width.

7. The apparatus of claim 6, wherein:
   the first data width corresponds to an output width of an analog to digital that samples the time wise continuous analog communication signal to produce the sequence of input digital samples; and
   the second data width corresponds to an input width of a digital signal processor communicatively coupled to the output of the digital gain block.

8. An apparatus comprising:
   a communication interface operable to receive a continuous time radio signal;
   a mixing module communicatively coupled to the communication interface and operable to down convert the continuous time radio signal to a continuous time analog signal;

an analog to digital converter communicatively coupled to the mixing module and operable to convert the continuous time analog signal to a sequence of input digital samples;

a digital gain block operable to receive the sequence of input digital samples to gain adjust the sequence of input digital samples based upon a gain setting to produce a sequence of output digital samples; and a gain setting block communicatively coupled to the digital gain block and operable to produce the gain setting, the gain setting block operable to produce the gain setting at any time as one of:

a first fixed gain setting;

a second fixed gain setting; and a filtered time varying gain setting applied when transitioning between the first fixed gain setting and the second fixed gain setting, wherein the gain setting block is further operable to produce the gain setting at any time as one of:

a third fixed gain setting;

the filtered time varying gain setting when transitioning between the first fixed gain setting and the third fixed gain setting; and the filtered time varying gain setting when transitioning between the second fixed gain setting and the third fixed gain setting.

9. An apparatus comprising:

a digital gain block operable to receive a sequence of input digital samples corresponding to a continuous time analog signal and to gain adjust the sequence of input digital samples based upon a gain setting to produce a sequence of output digital samples; and a gain setting block communicatively coupled to the digital gain block and operable to produce the gain setting, the gain setting block operable to produce the gain setting at any time as one of:

a first fixed gain setting;

a second fixed gain setting; and a filtered time varying gain setting applied when transitioning between the first fixed gain setting and the second fixed gain setting, wherein the gain setting block-comprises:

a transition gain block having an input and an output operable to produce the filtered time varying gain setting based upon the input;

a fixed gain block having an input and an output operable to produce the first fixed gain setting or the second fixed gain setting based upon the input;

a multiplexer having a pair of signal inputs communicatively coupled to receive the outputs of the transition gain block and the fixed gain block, a selection input, and an output that produces the gain setting; and a gain control block communicatively coupled to the transition gain block, the fixed gain block, and the multiplexer, the gain control block operable to provide the input to the transition gain block, the input to the fixed gain block, and the selection input to the multiplexer.

10. The apparatus of claim 9, wherein:

an input of the digital gain block has a first data width;

an output of the digital gain block has a second data width; and the gain setting block produces the gain setting so that the sequence of output digital samples substantially fills the second data width.

11. The apparatus of claim 9, wherein the gain setting block selects the gain setting based upon at least one value of the sequence of input digital samples.

12. The apparatus of claim 9, wherein the gain setting block selects the gain setting based upon at least one value of the sequence of output digital samples.

13. The apparatus of claim 9, wherein a power spectral density of the filtered time varying gain setting is lower in frequency and substantially non-convergent with a power spectral density of the sequence of input digital samples.

14. An apparatus comprising:

a digital gain block operable to receive a sequence of input digital samples corresponding to a continuous time analog signal and to gain adjust the sequence of input digital samples based upon a gain setting to produce a sequence of output digital samples; and a gain setting block communicatively coupled to the digital gain block and operable to produce the gain setting, the gain setting block operable to produce the gain setting at any time as one of:

a first fixed gain setting;

a second fixed gain setting; and a filtered time varying gain setting applied when transitioning between the first fixed gain setting and the second fixed gain setting, wherein:

an input of the digital gain block has a first data width;

an output of the digital gain block has a second data width; and the gain setting block produces the gain setting so that the sequence of output digital samples substantially fills the second data width and, wherein:

the first data width corresponds to an output width of an analog to digital that samples the time wise continuous analog communication signal to produce the sequence of input digital samples; and the second data width corresponds to an input width of a digital signal processor communicatively coupled to the output of the digital gain block.

15. The apparatus of claim 14, wherein the gain setting block-comprises:

a transition gain block having an input and an output operable to produce the filtered time varying gain setting based upon the input;

a fixed gain block having an input and an output operable to produce the first fixed gain setting or the second fixed gain setting based upon the input;

a multiplexer having a pair of signal inputs communicatively coupled to receive the outputs of the transition gain block and the fixed gain block, a selection input, and an output that produces the gain setting; and a gain control block communicatively coupled to the transition gain block, the fixed gain block, and the multiplexer, the gain control block operable to provide the input to the transition gain block, the input to the fixed gain block, and the selection input to the multiplexer.

16. An apparatus comprising:

a digital gain block operable to receive a sequence of input digital samples corresponding to a continuous time analog signal and to gain adjust the sequence of input digital samples based upon a gain setting to produce a sequence of output digital samples; and a gain setting block communicatively coupled to the digital gain block and operable to produce the gain setting, the gain setting block operable to produce the gain setting at any time as one of:

a first fixed gain setting;

a second fixed gain setting; and a filtered time varying gain setting applied when transitioning between the first fixed gain satin and the gain setting, wherein the gain setting block is further operable to produce the gain, setting at any time as one of:
a third fixed gain setting;
the filtered time varying gain setting when transitioning between the first fixed gain setting and the third fixed gain setting; and
the filtered time varying gain setting when transitioning between the second fixed gain setting and the third fixed gain setting.

17. A method in a receiving apparatus comprising:
receiving a continuous time radio signal;
down converting the continuous time radio signal to a continuous time analog signal;
converting the continuous time analog signal to a sequence of input digital samples;
gain adjusting the sequence of input digital samples based upon a gain setting to produce a sequence of output digital samples; and
producing the gain setting at any time as one of
a first fixed gain setting;
a second fixed gain setting; and
a filtered time varying gain setting applied when transitioning between the first fixed gain setting and the second fixed gain setting,
wherein the gain setting block is further operable to produce the gain setting time as one of:
a third fixed gain setting;
the filtered time varying gain setting when transitioning between the first fixed gain setting and the third fixed gain setting; and
the filtered time varying gain setting when transitioning between the second fixed gain setting and the third fixed gain setting.

18. The method of claim 17, wherein producing the gain setting at any time comprises selecting the gain setting to so that the sequence of output digital samples substantially fills a selected data width.

19. The method of claim 17, wherein the gain setting produced at any time is based upon at least one value of the sequence of input digital samples.

20. The method of claim 17, wherein the gain setting produced at any time is based upon at least one value of the sequence of output digital samples.

21. The method of claim 17, wherein a power spectral density of the filtered time varying gain setting is lower in frequency and substantially non-convergent with a power spectral density of the sequence of input digital samples.

22. The method of claim 17, wherein the filtered time varying gain setting applied when transitioning between the first fixed gain setting and the second fixed gain setting has an exponential shape with respect to time.

23. The method of claim 17, wherein the filtered time varying gain setting applied when transitioning between the first fixed gain setting and the second fixed gain setting has a linear relationship with respect to time.

\* \* \* \* \*

UNITED STATES PATENT AND TRADEMARK OFFICE
CERTIFICATE OF CORRECTION

| | | |
|---|---|---|
| PATENT NO. | : 7,856,073 B2 | Page 1 of 1 |
| APPLICATION NO. | : 11/302771 | |
| DATED | : December 21, 2010 | |
| INVENTOR(S) | : May | |

It is certified that error appears in the above-identified patent and that said Letters Patent is hereby corrected as shown below:

Column 8 line 6 after the word operable please insert -- to receive a continuous --
Column 10 line 67 after the word gain please delete "setin" and insert -- setting --
Column 10 line 67 after the word the please insert -- second fixed --

Signed and Sealed this
Nineteenth Day of April, 2011

David J. Kappos
*Director of the United States Patent and Trademark Office*